United States Patent
Wu et al.

(10) Patent No.: US 7,645,494 B2
(45) Date of Patent: Jan. 12, 2010

(54) PRE-PLATING SURFACE TREATMENTS FOR ENHANCED GALVANIC-CORROSION RESISTANCE

(75) Inventors: Richard Wu, Chelmsford, MA (US); James Cornie, Cambridge, MA (US); Stephen Cornie, Watertown, MA (US); Hank Breit, Attleboro, MA (US); Larry Ballard, Denver, CO (US); Richard R. Malen, Tyngsboro, MA (US); Prabhat Kumar, Framingham, MA (US); John Shields, Cleveland, OH (US); Robert Desberg, Scottsdale, AZ (US)

(73) Assignee: H.C. Starck Inc., Newton, MA (US)

( * ) Notice: Subject to any disclaimer, the term of this patent is extended or adjusted under 35 U.S.C. 154(b) by 0 days.

(21) Appl. No.: 12/056,798

(22) Filed: Mar. 27, 2008

(65) Prior Publication Data
US 2008/0176005 A1 Jul. 24, 2008

Related U.S. Application Data

(62) Division of application No. 10/542,945, filed as application No. PCT/EP2004/000897 on Jan. 14, 2004, now Pat. No. 7,368,176.

(60) Provisional application No. 60/442,042, filed on Jan. 23, 2003.

(51) Int. Cl.
C23C 14/02 (2006.01)
B05D 3/00 (2006.01)
B05D 3/04 (2006.01)
C23F 1/00 (2006.01)

(52) U.S. Cl. .................. 427/534; 427/299; 427/307; 427/309; 216/75; 216/81; 216/100

(58) Field of Classification Search ................. 427/534, 427/405, 299, 307, 309; 205/210; 216/75, 216/77, 78, 81, 109, 102, 105
See application file for complete search history.

(56) References Cited

U.S. PATENT DOCUMENTS 3,411,995 A 11/1968 Saubestre et al.

(Continued)

FOREIGN PATENT DOCUMENTS

DE 29 08 693 9/1979

(Continued)

*Primary Examiner*—Michael Cleveland
*Assistant Examiner*—Michael Wieczorek
(74) *Attorney, Agent, or Firm*—Connolly Bove Lodge & Hutz LLP

(57) ABSTRACT

The invention relates to a method that involves (a) removing graphite from at least one surface of a metal graphite composite material; (b) chemically cleaning or plasma etching the surface of the metal graphite composite material; (c) applying a metal-containing material to the surface of the chemically cleaned or plasma etched metal graphite composite material, and thereby forming an intermediate layer; (d) applying a metal coating on the intermediate layer, and thereby forming a composite material. The invention also relates to a composite material comprising (a) a metal graphite composite substrate having at least one surface that is substantially free of graphite; (b) a metal-containing intermediate layer located on a surface of the substrate; and (c) a metal coating on the intermediate layer.

19 Claims, 2 Drawing Sheets

U.S. PATENT DOCUMENTS

| | | | | |
|---|---|---|---|---|
| 3,894,677 A | * | 7/1975 | La Iacona | 228/190 |
| 3,909,209 A | * | 9/1975 | Kruper et al. | 428/621 |
| 4,437,956 A | * | 3/1984 | Coates et al. | 205/661 |
| 4,555,303 A | * | 11/1985 | Legge et al. | 438/490 |
| 4,995,451 A | * | 2/1991 | Hamburgen | 165/104.33 |
| 5,730,853 A | * | 3/1998 | Smith et al. | 205/210 |
| 2003/0024611 A1 | | 2/2003 | Cornie et al. | |

FOREIGN PATENT DOCUMENTS

| | | |
|---|---|---|
| GB | 2 017 762 | 10/1979 |
| JP | 63-190176 | 8/1988 |
| JP | 11-209879 | 8/1999 |

* cited by examiner

PRE-PLATING SURFACE TREATMENTS FOR ENHANCED GALVANIC-CORROSION RESISTANCE

CROSS-REFERENCE TO RELATED APPLICATIONS

This application is a divisional of U.S. Pat. No. 7,368,176, issued May 6, 2008, from U.S. application Ser. No. 10/542,945, filed Jan. 17, 2006, which was a national stage application under 35 U.S.C. § 371 of PCT/EP2004/000897, filed Jan. 14, 2004, which claimed benefit of U.S. Provisional Application No. 60/442,042, filed Jan. 23, 2003.

BACKGROUND

Metal-coated metal (or metal alloy) graphite composite materials have been used in thermal applications. Unfortunately, conventional methods for coating such metal graphite composite materials have disadvantages. For instance, it has been discovered that when conventionally coated metal graphite composite materials are used, graphite extends into and often protrudes through a metal coating, and thereby results in the coating to fail. Such a fiber protruding through a metal coating creates a channel for communication of moisture which causes corrosion. Also, fibers protruding through the coating also provide a channel for gas permeation through the composite.

Another problem of conventionally metal graphite composite materials is that the difference in the thermal expansion coefficients between the surface graphite in the composite material and the coating causes cracks in the brittle metal coating. Such defects impair the performance of the metal graphite composite materials.

For the foregoing reasons, it would be advantageous to develop a metal-coated metal graphite composite material that is hermetically sealed.

For the foregoing reasons, it would be advantageous to develop a metal-coated metal graphite composite material that is impervious to chemicals.

For the foregoing reasons, it would be advantageous to develop metal-coated graphite material that is corrosion resistant.

For the foregoing reasons, there is a need to develop a method that produces a metal-coated metal graphite composite material that is corrosion-resistant.

For the foregoing reasons, there is a need to develop a method that produces a metal-coated metal graphite composite material that is hermetically sealed.

SUMMARY

The invention relates to a method that involves (a) removing graphite from at least one surface of a metal graphite composite material; (b) chemically cleaning or plasma etching the surface of the metal graphite composite material; (c) applying a metal-containing material to the surface of the chemically cleaned or plasma etched metal graphite composite material, and thereby forming an intermediate layer; (d) applying a metal coating on the intermediate layer, and thereby forming a metal-coated metal graphite composite material. The invention also relates to a metal-coated metal graphite composite material which can be made from such a method, e.g., a metal-coated metal graphite composite material comprising (a) a metal graphite composite substrate having at least one surface that is substantially free of graphite; (b) a metal-containing intermediate layer located on the substrate; and (c) a metal coating on the intermediate layer.

DESCRIPTION OF THE FIGURES

These and other features, aspects, and advantages of the present invention will become better understood with reference to the following description and appended claims, where:

DESCRIPTION

Figure 1:
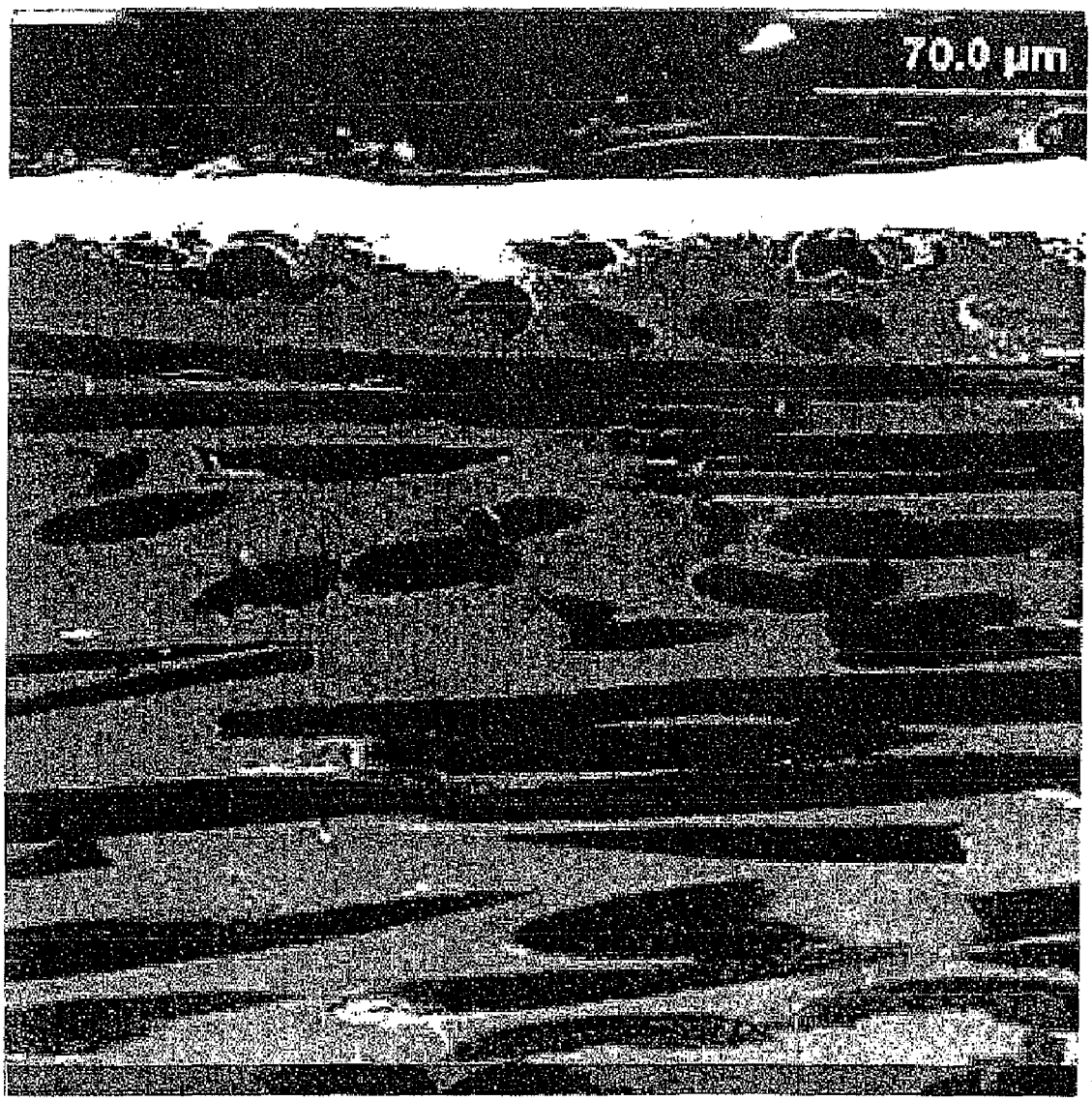
FIG. 1 is a picture of an aluminum graphite composite material that is made in accordance to the invention.
Figure 2:
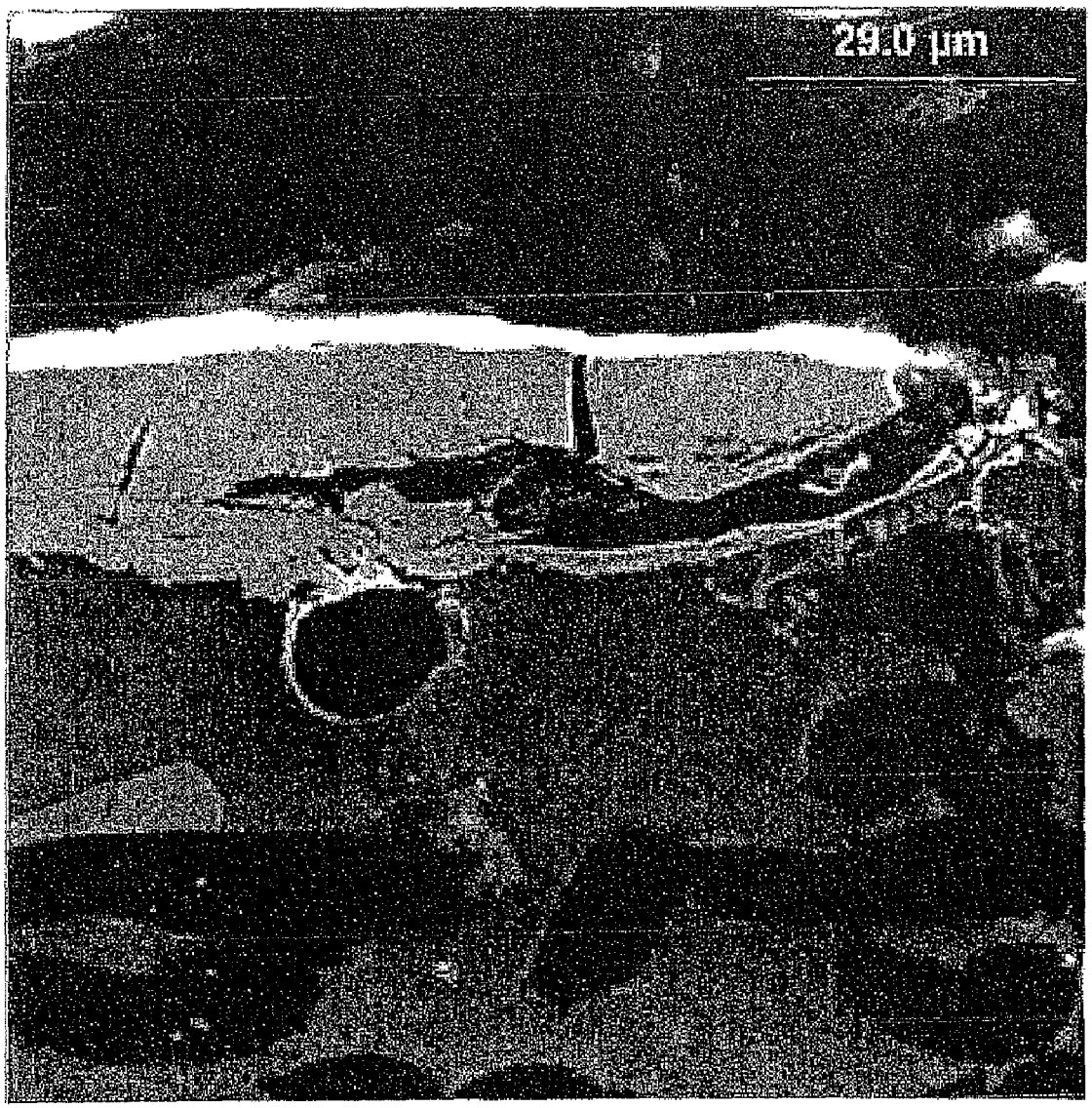
FIG. 2 is a picture of an aluminum graphite composite material made without supplemental surface modifications (not in accordance to the invention), in which fibers protrude a nickel coating.

The invention relates to a method comprising (a) removing graphite from at least one surface of a metal graphite composite material; (b) chemically cleaning or plasma etching the surface of the metal graphite composite material; (c) applying a metal-containing material to the surface of the chemically cleaned or plasma etched metal graphite composite material, and thereby forming an intermediate layer; (d) applying a metal coating on the intermediate layer, and thereby forming a metal-coated metal graphite composite material. Preferably, the composite material formed in step (d) of the method has a surface that is hermetically sealed or corrosion-resistant or both hermetically sealed and corrosion resistant. The invention also relates to a metal-coated composite material comprising (a) a metal graphite composite substrate having at least one surface that is substantially free of graphite; (b) a metal-containing intermediate layer located on a surface of the substrate; and (c) a metal coating on the intermediate layer.

The metal graphite composite material from whose surface graphite is removed can be any metal graphite composite material, which when used in accordance with the invention, enables the production of a metal-coated metal graphite composite material of the invention. Generally, the metal graphite composite material can be an aluminum graphite composite material, a copper graphite composite material, a magnesium graphite material, or combinations of such materials. Also, aluminum alloy graphite composite materials, copper alloy graphite composite materials, magnesium alloy graphite materials, and combinations of the foregoing can be used.

The metal graphite composite material is preferably a metal matrix composite that includes random in-plane discontinuous fibers. Use of random in-plane discontinuous fibers permits a high fiber volume fraction in the metal matrix composite ("in plane" as used herein is understood as the X-Y plane, e.g., the plane parallel to the bonded surface of a heat sink). Further, by using in-plane oriented fibers, substantially all of the fibers can contribute to the control of the coefficient of thermal expansion in the X-Y plane. Though Z-direction coefficient of thermal expansion is not controlled by in-plane fibers, such control is generally unnecessary for heat sink applications because the integrated circuit or other object is attached to an X-Y oriented surface of the heat sink.

Advantageously, use of these in-plane oriented fibers permits selection of a coefficient of thermal expansion over a wide range of values. A desired volume fraction of in-plane oriented fibers is selected to obtain a desired coefficient of thermal expansion. By orienting substantially all of the fibers in the X-Y plane, a very high volume fraction can be obtained. This permits selection of the volume fraction over a wide range and a corresponding ability to select a wide range of coefficient of thermal expansion values.

In one embodiment, the metal graphite composite material has a volume fraction of random in-plane discontinuous fibers ranging from about 0.15 to about 0.6. In another embodiment, a minority of the random in-plane discontinuous fibers are oriented out of plane by an angle greater than about 10°. In a preferred embodiment, the random in-plane discontinuous fibers are uniformly distributed within the metal matrix composite. Preferably, the metal matrix composite material is an aluminum graphite composite material.

The metal graphite composite material generally has a carbon fiber content that is sufficient to enable the material to be used in accordance with the invention. In one embodiment, the composite material has a carbon fiber content that is at least about 30 wt. %, or at least about 40 wt. %. In one embodiment, the metal graphite composite material has a carbon fiber ranging from about 30 wt. % to about 40 wt. %. The metal graphite composite material of can have carbon fiber content of various quantities. In one embodiment, the carbon content is at least about 15%. In another embodiment, the carbon content ranges from about 15% to about 60%. Examples of suitable metal graphite composite materials can be found in U.S. Ser. No. 09/855,466, incorporated herein by reference in its entirety.

Graphite can be removed from the metal graphite composite material by any technique, which enables graphite to be removed from a composite material so that a composite material of the invention can be made. For instance, graphite can be removed by a technique selected from those such as oxidation techniques, vibratory finishing techniques, plasma stripping techniques, glow discharge techniques, mechanical blasting techniques, lapping techniques, and combinations thereof. Vibratory finishing techniques generally involve the use of components and abrasives that move relative to each others surfaces. Plasma stripping techniques generally involve partially ionized gas (e.g. Ar) containing an equal number of positive and negative charges, as well as some other number of non-ionized gas particles, striking the surfaces of the components. Glow discharge techniques generally involve the use of globally neutral regions, as well as regions containing net positive and negative charge particles striking the surfaces of the components. Most thin film processes use "plasma" and "glow discharge" interchangeably. Mechanical blasting techniques generally involve the use of abrasive materials such as glass beads, alumina powders, impinge under pressure on the surfaces of components. Lapping techniques generally involve the use of liquid abrasive media that is injected between components and rotating plates on one or both sides of components. These techniques are known to the skilled artisan.

When oxidation is selected as a technique for removing graphite, the metal graphite composite material can be oxidized by any technique that enables the removal of at least some of the graphite from a surface of the metal graphite composite material. Preferably, the metal graphite composite material is oxidized by heating the metal graphite composite material to a temperature that is sufficiently high to oxidize the composite material and remove graphite from the composite material. Generally, the maximum temperature at which the metal graphite composite material is oxidized is below the melting temperature of the metal graphite composite material. In one embodiment, the temperature at which the metal graphite composite material is oxidized is at least about 250° C.

The amount of graphite removed from a surface of the metal graphite composite material is sufficient to enable the metal graphite composite material to be made in accordance to the method of the invention. In one embodiment, at least 10% of residual graphite remains on or below the surface of the metal graphite composite material. In another embodiment, less than 10% of residual graphite remains on or below the surface of the metal graphite composite material. In another embodiment, substantially all of the graphite from the surface is removed. In another embodiment, one hundred percent of the graphite is removed from the surface.

The metal graphite composite material can be chemically cleaned by any technique that enables the metal graphite composite material to be made in accordance to the invention. Examples of suitable chemicals for cleaning a surface of the metal graphite composite material include chemicals used in higher pH alkaline chemical cleaning techniques. The metal graphite composite material is generally cleaned by dipping and rinsing operations. In one embodiment, the metal composite material is subjected to a plasma etching treatment instead of a chemically cleaning treatment.

The metal-containing intermediate layer, e.g., a film, that is applied to a surface of the chemically cleaned or plasma etched metal graphite composite material can contain a metal that enables the production of a metal-coated metal graphite composite material of the invention. Examples of suitable metal materials include zinc, gold, and combinations thereof. Preferably, the metal-containing intermediate layer is applied is a zinc-containing material. More preferably, the zinc-containing material is a zincate.

The metal-containing material that is applied to the surface of the chemically cleaned or plasma etched graphite composite material generally forms an intermediate layer that can have various thicknesses. In one embodiment, the intermediate layer has thickness that is less than about 1 micron. In another embodiment, the intermediate layer has a thickness ranging from about 1 nanometer to about 1 micron.

The metal-containing intermediate layer can be applied to a surface of the chemically cleaned or plasma etched metal graphite composite material by any suitable technique that enables the metal graphite composite material to be treated in accordance to the method of the invention and preferably form a composite material having a surface that is hermetically sealed or corrosion-resistant or both hermetically sealed and corrosion resistant. Examples of suitable techniques for applying the metal-containing material to a surface of the chemically cleaned or plasma etched metal graphite composite material include plating techniques, (e.g., immersion coating techniques, electroplating techniques), physical vapor deposition techniques, chemical vapor deposition techniques, ion vapor deposition techniques, and combinations thereof. These techniques are well known and known to the skilled artisan. Preferably, the metal-containing material is added to a surface of a metal graphite composite material by electroplating techniques.

The metal coating that is applied onto the intermediate layer can be made of any metal that enables the invention to be practiced. Generally, the metal of the coating will be selected from aluminum, copper, nickel, gold, silver, rhodium, ruthenium, aluminum alloys, copper alloys, nickel alloys, gold alloys, silver alloys, rhodium alloys, ruthenium alloys, and combinations of the foregoing. In one embodiment, the metal coating applied on the intermediate layer includes multilayer coatings, e.g., a coating made of Ni and Au layers.

The metal coating that is applied by any technique that enables a suitable metal to be applied onto a surface covered by the metal-containing material. The metal coating is applied by a technique selected from plating techniques, e.g., electroplating, physical vapor deposition techniques, chemical vapor deposition techniques, ion vapor deposition techniques, and combinations thereof. As mentioned above, these techniques are well known and known to the skilled artisan.

The metal coating is applied to the intermediate layer generally has a thickness that is less than about 100 microns. Preferably, the metal coating is at least 1 about micron, or from about 1 micron to about 75 microns. Preferably, the coating is a galvanic-corrosion resistant and hermetically sealed coating.

In use, a suitable metal graphite composite material is selected for treatment. Graphite is removed from at least one surface of a metal graphite composite material. Advantageously, fibers which extend above the surfaces and others on/in the metal surface are removed in a controlled fashion. The graphite present on the at least one surface is generally present in less than about 60% of the total surface area. In one embodiment, at least one surface of the metal graphite composite material is smoothened before the metal graphite composite material is subjected to chemical cleaning or etching, e.g., before or after graphite is removed from the surface and before the composite is subjected to chemical cleaning or plasma etching. The surface can be smoothened by a technique selected from the group consisting of lapping techniques, ivadizing techniques, peening techniques, and combinations thereof.

Once graphite has been removed from a surface of the metal graphite composite material, the metal graphite composite material is chemically cleaned or plasma etched with a suitable technique. Thereafter, an intermediate layer forms by applying a metal-containing material to the surface of the chemically cleaned or plasma etched metal graphite composite material. Finally, a metal coating is applied on the intermediate layer, and the metal-coated metal graphite composite material forms. The composite material formed by the method of the invention preferably has a surface that is hermetically sealed or corrosion-resistant or both hermetically sealed and corrosion resistant. Also, the composite material of the invention is preferably also impervious to chemicals. Advantageously, the metal-coated metal graphite composite material of the invention can be corrosion resistant and/or hermetically sealed under various operating conditions. To test the corrosion properties of a coated composite material, the coated composite material of the invention can be salt sprayed according to military or ASTM standards. To test for hermeticity, a composite material of the invention can be placed in a sealed chamber which is pressured with a gas (e.g. He), and its leakage rate can be checked.

Although the present invention has been described in detail with reference to certain preferred versions thereof, other variations are possible. Therefore, the spirit and scope of the appended claims should not be limited to the description of the versions contained therein.

What is claimed is:

1. A method comprising:
   (a) providing a metal graphite composite material having a carbon fiber content and a surface, and removing graphite from the composite material such that the composite material surface has a reduced carbon fiber content which is 10% or less of the carbon fiber content of the material;
   (b) chemically cleaning or plasma etching the surface of the metal graphite composite material;
   (c) applying a metal-containing material to the surface of the chemically cleaned or plasma etched metal graphite composite material, and thereby forming an intermediate layer;
   (d) applying a metal coating on the intermediate layer, and thereby forming a metal-coated metal graphite composite material.

2. The method of claim 1, wherein the graphite is removed by a technique selected from the group consisting of oxidation techniques, vibratory finishing techniques, plasma stripping techniques, glow discharge techniques, mechanical blasting techniques, lapping techniques, and combinations thereof.

3. The method of claim 1, wherein the composite material formed in step (d) has a surface that is hermetically sealed or corrosion-resistant or both hermetically sealed and corrosion resistant.

4. The method of claim 1, wherein in step (c), the metal-containing material that is applied is a zinc-containing material.

5. The method of claim 4, wherein the zinc-containing material is a zincate.

6. The method of claim 1, wherein the metal coating in step (d) is selected from the group consisting of aluminum, copper, nickel, gold, silver, rhodium, ruthenium, aluminum alloys, copper alloys, nickel alloys, gold alloys, silver alloys, rhodium alloys, ruthenium alloys, and combinations of the foregoing.

7. The method of claim 1, wherein metal graphite composite material has a carbon fiber content ranging from about 30 wt.% to about 40 wt%.

8. The method of claim 1, wherein the metal graphite composite material is selected from the group consisting of aluminum graphite composite materials, copper graphite composite materials, magnesium graphite materials, aluminum alloy graphite composite materials, copper alloy graphite composite materials, magnesium alloy graphite materials, and combinations thereof.

9. The method of claim 1, wherein in step (a), graphite is removed by subjecting the metal graphite composite material to oxidization by heating the metal graphite composite material to a temperature that is sufficiently high to oxidize the composite material and remove graphite from the composite material.

10. The method of claim 9, wherein the temperature is at least about 250° C.

11. The method of claim 9, wherein the temperature at which heating the metal graphite composite material is carried out has a maximum value below the melting temperature of the metal of the metal graphite composite material.

12. The method of claim 1, wherein the metal-containing material applied in step (c) forms a thin film of a zinc-containing material having thickness that is less than about 1 micron.

13. The method of claim 1, wherein the metal-containing material applied in step(c) forms a thin film of a zincate having a thickness ranging from about 1 nanometer to about 1 micron.

14. The method of claim 1, wherein the metal coating is applied by a technique selected from the group consisting of plating techniques, immersion coating techniques, physical vapor deposition techniques, chemical vapor deposition techniques, ion vapor deposition techniques, and combinations thereof.

15. The method of claim 1, wherein the metal coating is applied to a zinc-containing intermediate layer and the metal coating has a thickness that is less than about 100 microns.

16. The method of claim 1, wherein the metal coating is applied on a zinc-containing film and the metal coating has a thickness of about 1 micron.

17. The method of claim 1, wherein the method further comprises smoothening a surface of the metal graphite composite material before the metal graphite composite material is subjected to chemical cleaning or etching.

18. The method of claim 17, wherein the surface is smoothened by a technique selected from the group consisting of lapping techniques, peening techniques, and combinations thereof.

19. The method of claim 1, wherein the metal coating is applied on a zinc-containing film and the metal coating has a thickness of about 1 micron to about 75 microns.

* * * * *